(12) United States Patent
Malach et al.

(10) Patent No.: US 8,286,040 B2
(45) Date of Patent: Oct. 9, 2012

(54) DEVICE AND METHOD FOR TESTING A CIRCUIT

(75) Inventors: Gal Malach, Gedera (IL); Nir Blinky, Tel Aviv (IL); Lior Moheban, Ramat-Gan (IL)

(73) Assignee: Freescale Semiconductor, Inc., Austin, TX (US)

( * ) Notice: Subject to any disclaimer, the term of this patent is extended or adjusted under 35 U.S.C. 154(b) by 483 days.

(21) Appl. No.: 12/526,397

(22) PCT Filed: Feb. 9, 2007

(86) PCT No.: PCT/IB2007/050435
§ 371 (c)(1),
(2), (4) Date: Aug. 7, 2009

(87) PCT Pub. No.: WO2008/096209
PCT Pub. Date: Aug. 14, 2008

(65) Prior Publication Data
US 2010/0090706 A1   Apr. 15, 2010

(51) Int. Cl.
*G01R 31/28* (2006.01)
*G06F 11/00* (2006.01)
(52) U.S. Cl. ............................ 714/726; 714/3
(58) Field of Classification Search .......... 714/726, 714/729, 30, 724; 716/4
See application file for complete search history.

(56) References Cited

U.S. PATENT DOCUMENTS

| | | | |
|---|---|---|---|
| 6,557,129 B1 * | 4/2003 | Rajski et al. | 714/729 |
| 6,754,359 B1 * | 6/2004 | Svean et al. | 381/328 |
| 6,829,740 B2 | 12/2004 | Rajski et al. | |
| 7,500,163 B2 * | 3/2009 | Rajski et al. | 714/729 |
| 7,523,370 B1 * | 4/2009 | Keller | 714/726 |
| 7,757,138 B2 * | 7/2010 | Matsuo et al. | 714/726 |
| 7,805,649 B2 * | 9/2010 | Rajski et al. | 714/732 |
| 7,913,137 B2 * | 3/2011 | Mukherjee et al. | 714/729 |
| 7,949,921 B2 * | 5/2011 | Gizdarski | 714/729 |
| 8,108,743 B2 * | 1/2012 | Rajski et al. | 714/732 |
| 2003/0115521 A1 | 6/2003 | Rajski et al. | |
| 2003/0229833 A1 | 12/2003 | Nadeau-Dostie | |
| 2004/0237015 A1 | 11/2004 | Abdel-Hafez et al. | |
| 2005/0055613 A1 | 3/2005 | Mitra et al. | |
| 2005/0240848 A1 | 10/2005 | Cote et al. | |
| 2006/0156122 A1 | 7/2006 | Wang et al. | |

FOREIGN PATENT DOCUMENTS

| | | |
|---|---|---|
| WO | 03075028 A1 | 2/2003 |
| WO | 2005031378 A1 | 9/2004 |

OTHER PUBLICATIONS

International Search Report and Written Opinion correlating to PC/IB2007/050435 dated Oct. 31, 2007.
Chickermane, V. et al., "Channel Masking Synthesis for Efficient On-Chip Test Compression," ITC International Test Conference, IEEE 2004, Paper 15.3, ISBN 0-7803-8580-2/04;,pp. 452-461.

* cited by examiner

*Primary Examiner* — Phung M Chung

(57) ABSTRACT

A device having testing capabilities, the device includes: a tested circuit that includes multiple scan chains; a compactor adapted to compress scan chain test responses; a mask unit, connected between the multiple scan chains and the compactor, wherein the mask unit is adapted to mask scan chain test responses outputted by the multiple scan chains during a masking period; and an mask prevention unit, adapted to prevent masking of scan chain test responses during a mask prevention period that at least partially overlaps a mask unit configuration period.

20 Claims, 7 Drawing Sheets

200

DEVICE AND METHOD FOR TESTING A CIRCUIT

FIELD OF THE INVENTION

The present invention relates to devices that have testing capabilities and methods for testing a circuit.

BACKGROUND OF THE INVENTION

Modern integrated circuits are getting more and more complex. In order to evaluate the functionality of integrated circuits various testing techniques were developed. One way to test the functionality of an integrated circuit uses scan chains. Scan chains include multiple components that are serially connected to each other during a scan mode of the integrated circuit. These scan chains are used to propagate test stimulations and test responses. The number of scan chains per integrated circuit is usually selected as a compromise between scan test speed (which requires more scan chains) and number of integrated circuit pins that are allocated for scan mode tests.

Some prior art scan method use a compactor (or compressor) that compresses scan chain test responses. The compression can be very effective in reducing the number of integrated circuit pins allocated for outputting scan chain test responses but is subject to the corruption of valid scan chain test responses by unknown or indefinite logical states. Various prior art compactors (including spatial compactors and temporal compactors) are illustrated in U.S. Pat. No. 6,829,740 of Rajski et al., and in U.S patent application serial number 2005/0055613A1 of Mitra et al. both being incorporated herein by reference.

In order to reduce the corruption of valid scan chain test responses a configurable mask can be used. The mask is configured by a multi-cycle configuration process during which mask configuration information serially propagates through the integrated circuit until reaching the configurable mask. This multi-cycle configuration process causes the configurable mask to mask valid scan chain test responses as well as indefinite scan chain test responses. If, for example, a mask is configured during x scan cycles, the k'th scan chain outputs an indefinite scan chain test response during the y'th scan cycle while outputting valid scan chain test responses during the next (x−1) scan cycles, then the configurable mask will mask the indefinite scan chain test response (during the y'th scan cycle) but also mask the valid scan chain test responses of the k'th scan chain that are outputted during the next (x−1) scan cycles.

There is a growing need to find effective devices and methods for testing a circuit.

SUMMARY OF THE PRESENT INVENTION

A device and a method for testing a circuit, as described in the accompanying claims.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

According to an embodiment of the invention a device and method are provided. The device and method selectively mask scan chains test responses during a masking period while preventing the masking of valid scan chains test responses during mask prevention periods. According to yet another embodiment of the invention a mask unit includes two (or more) mask circuits that selectively mask scan chain test responses. A first mask circuit is being updated at a higher update rate than the second mask circuit. Conveniently, the first mask circuit masks one scan chain output after the other while the second mask circuit configuration remains unchanged. Once the second mask circuit is re-configured the first mask circuit starts to mask one scan chain after the other.

Figure 1:
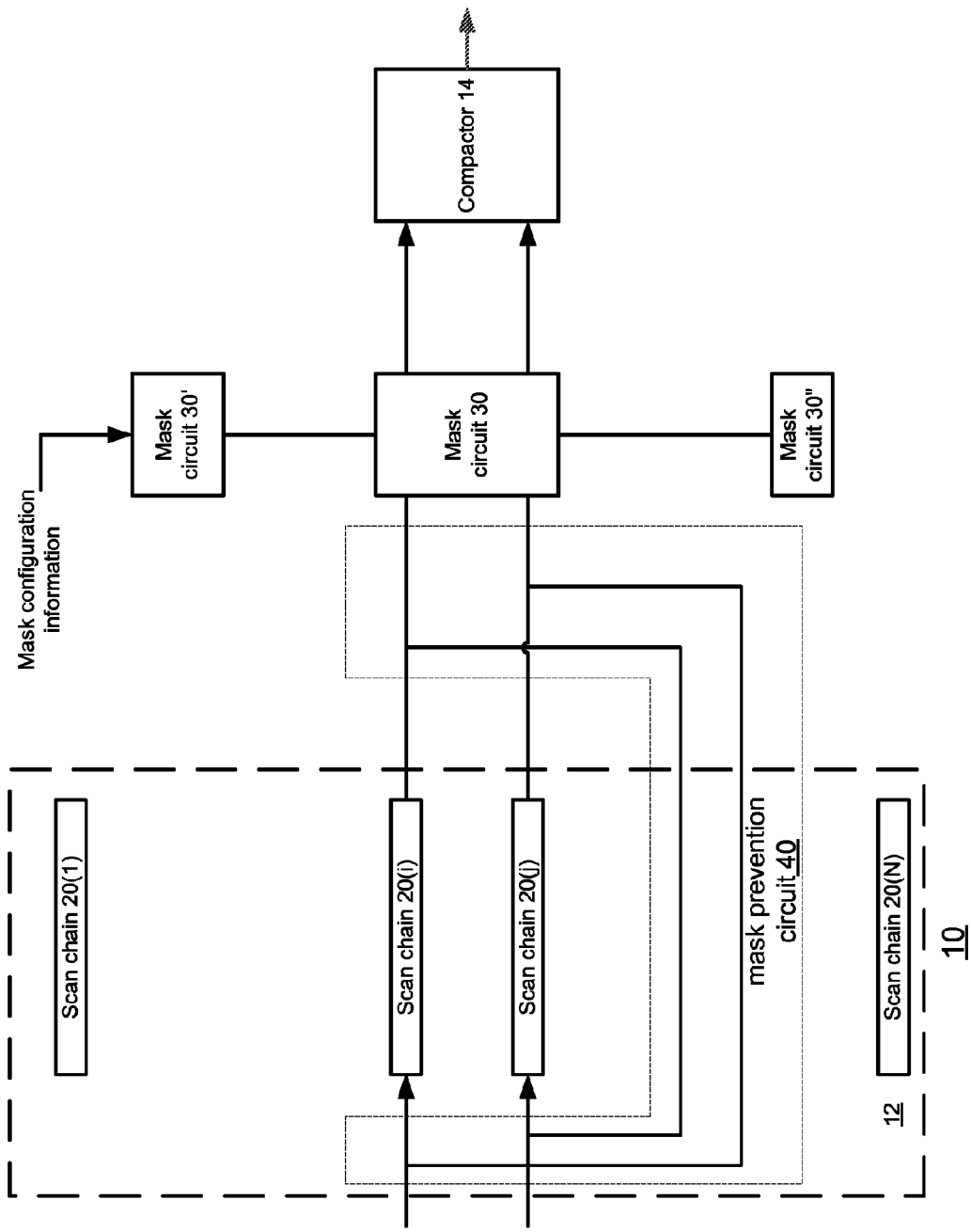
FIG. 1 illustrates a device according to an embodiment of the invention.
Figure 2:
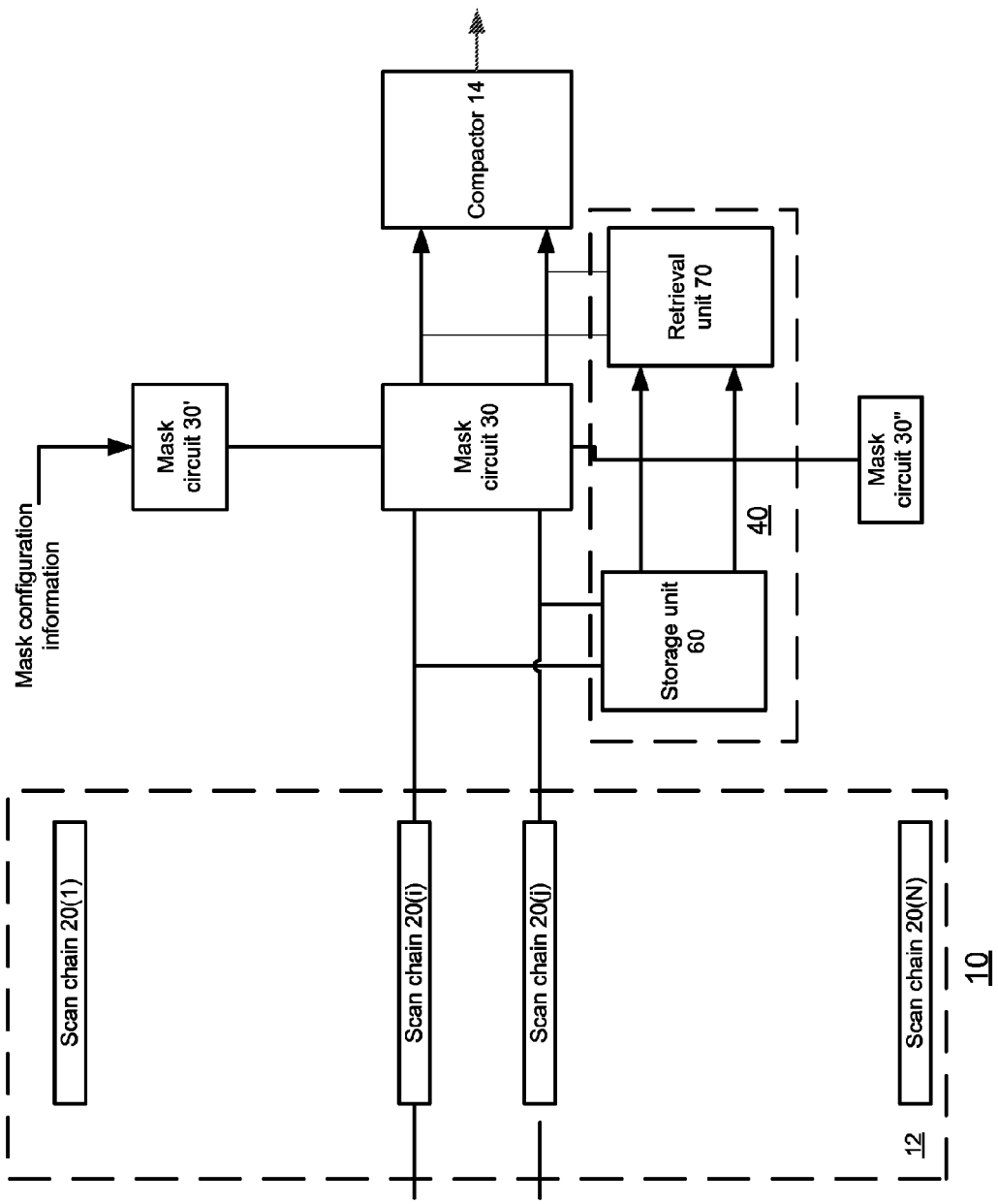
FIG. 2 illustrates a device according to another embodiment of the invention.
Figure 3:
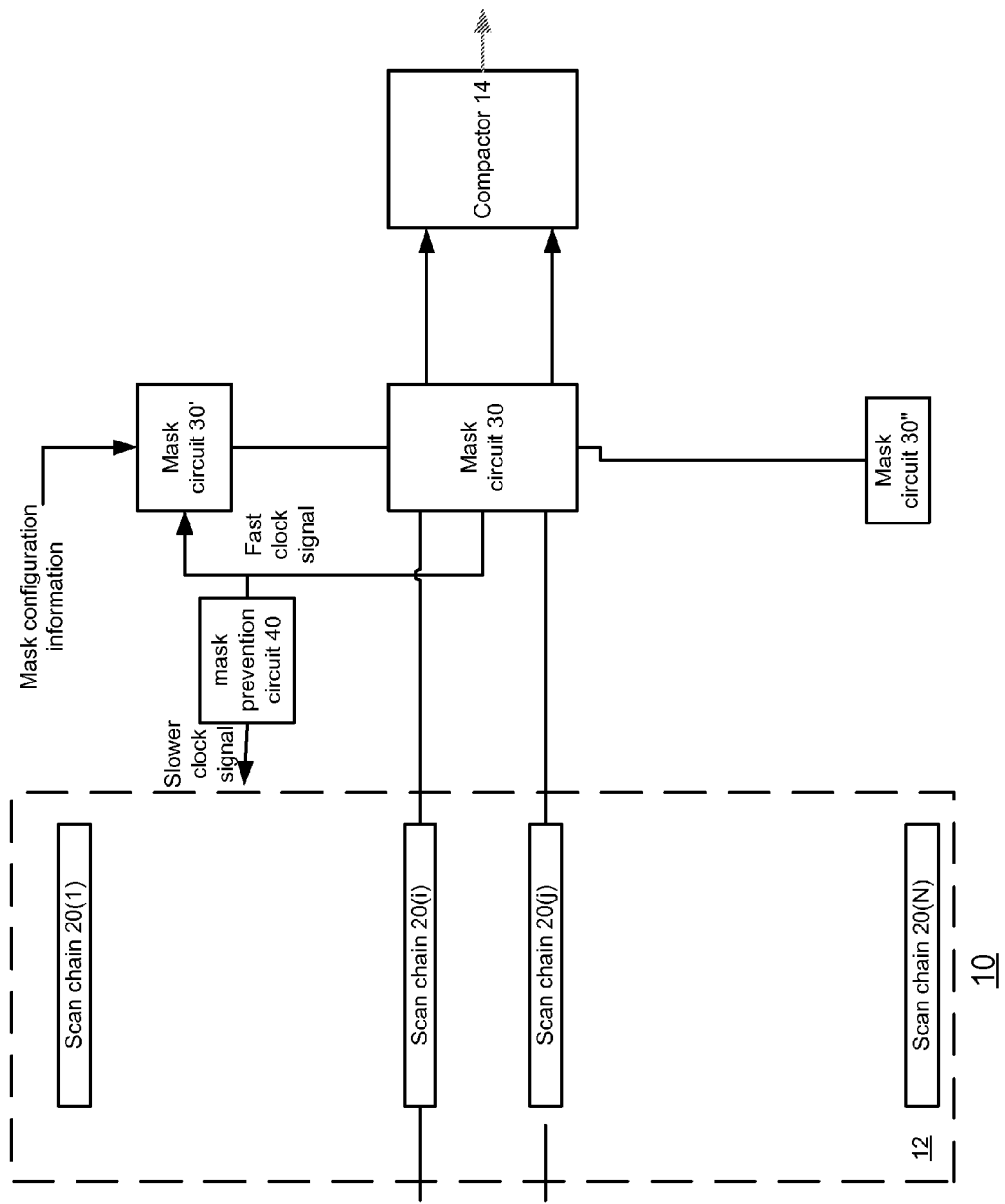
FIG. 3 illustrates a device according to a further embodiment of the invention.

FIG. 1-FIG. 3 illustrate device 10 according to various embodiments of the invention.

Device 10 can be an integrated circuit and it includes a tested circuit 12 that includes multiple scan chains 20(1)-20(N), collectively denoted 20. These scan chains usually receive test stimulations from dedicated pins of device 10. It is noted that in order to reduce the number of pins required for entering the rest stimulations the pins can be followed by an injector (or expander) than de-multiplexes the test stimulations provided via the input pins. For simplicity of explanation the injector was omitted from FIG. 1.

Device 10 includes multiple scan chains that are arranged in groups. Each group of scan chains is connected to a compactor, a mask unit and a mask prevention unit. The mask units are connected in a serial manner to each other to form a mask configuration information path through which mask configuration information propagates. Using many mask units is useful when there are many scan chains and there is a need to configure the mask units relatively quickly.

For simplicity of explanation FIG. 1 illustrates a group of scan chains 20(i)-20(j) and single compactor 14 that is connected to mask unit 30 and to mask prevention unit 40. In addition, FIG. 1 also illustrates mask unit 30 as being serially connected to mask units 30' and 30", such as to illustrate a portion of the mask configuration information path 11.

Figure 4:
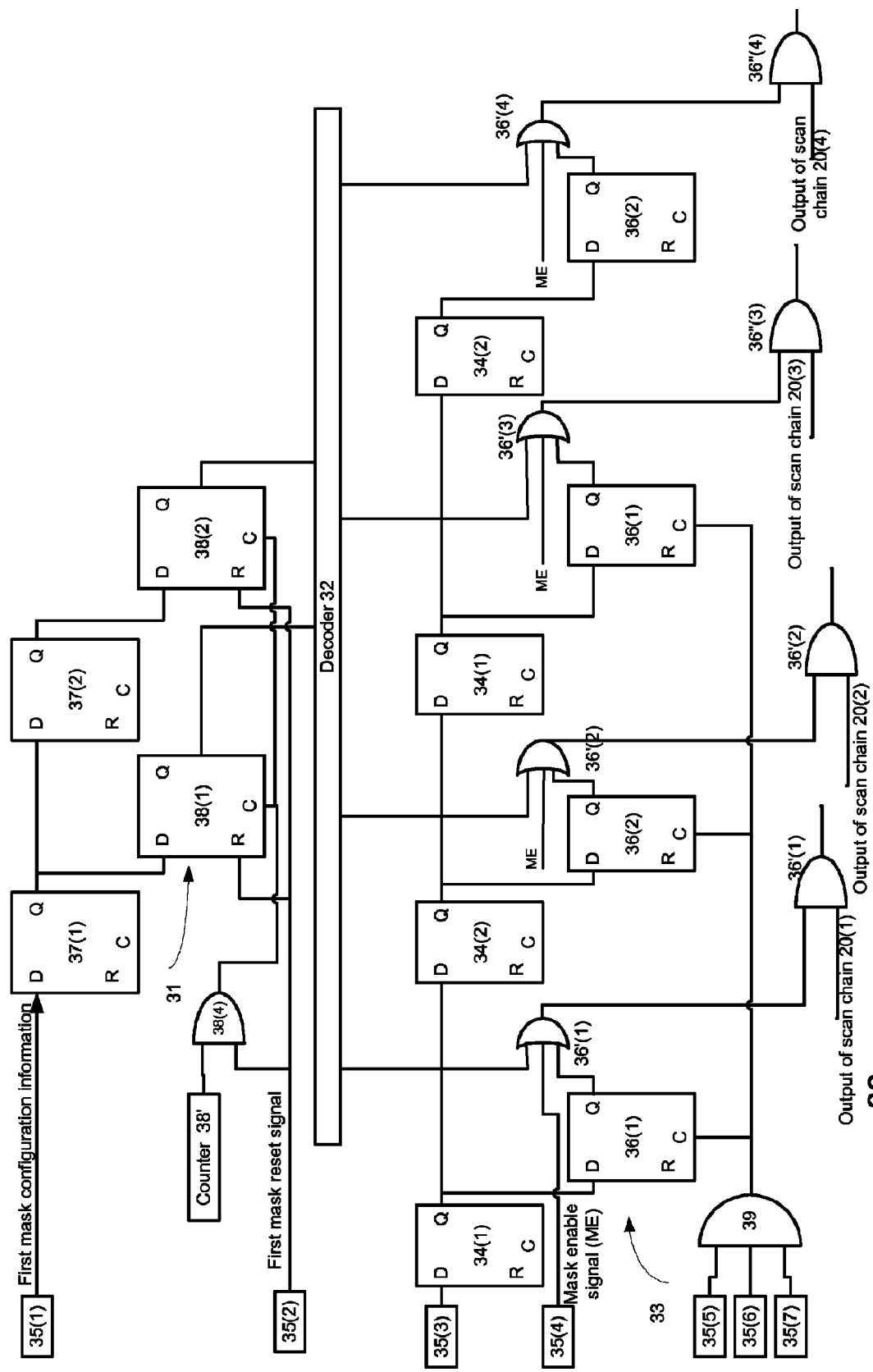
FIG. 4 illustrates a mask unit and its environment according to an embodiment of the invention.

It is noted that scan unit 30 can include one or more scan circuits. For simplicity of explanation FIG. 1-FIG. 3 and FIG. 5 illustrate a mask unit that includes a single mask circuit. FIG. 4 illustrates a mask unit that includes two mask circuits.

The configuration process of the mask units can be speeded up in various manners, including but not limited to: (i) using shadow mask units that participate in the propagation of the mask configuration information while the mask units mask scan chain test responses; (ii) propagating mask configuration information at a higher speed than the scan chain test responses propagate; (iii) propagating compressed (or encoded) mask configuration information and de-compressing (or decoding) the mask configuration information by the mask unit. It is noted that a combination of one or more of these mentioned above manners can also be used to speed up the configuration process.

Referring back to FIG. 1, the outputs of multiple scan chains 20(i)-20(j) are connected to mask unit 30 and to mask prevention unit 40. During a masking period the scan chain test responses outputted by the scan chains are sent to compactor 14 via mask unit 30. During a mask prevention period the scan chain test responses outputted by the scan chains are sent to mask prevention unit 40.

Mask unit 30 is configured during a mask prevention period and optionally even during at least a portion of the masking period. Thus, after a masking period ends and until the mask unit 30 is re-configured to a new desired configuration the device prevents valid scan chain test responses from being masked. The outputs of the scan chains are sent via mask prevention unit 40.

It is noted that a scan test of tested circuit 12 includes multiple masking and mask prevention periods. The mask unit is re-configured multiple times during the scan test in order to mask indefinite scan chain test responses. These indefinite scan chain test responses can be predicted in various manners.

According to various embodiments of the invention, illustrated in FIG. 1-FIG. 3, mask prevention unit 40 can be adapted to perform at least one of the following operations: (i) bypass mask unit 30 during the mask prevention period, (ii) stop a propagation of scan chain test responses over the multiple scan chains 20(i)-20(j) during the mask prevention period while allowing a propagation of mask configuration information towards the mask unit 30, (iii) couple an output of each scan chain 20(n) to the input of the scan chain 20(n) during the mask prevention period; (iv) propagate the scan chain test responses within the multiple scan chains until the multiple scan chains output scan chain test responses provided to the inputs of the multiple scan chains at the beginning of the mask prevention period; (v) store scan chain test responses during the mask prevention period and retrieve the scan chain test responses stored in the at least one storage unit 60 after an end of the mask prevention period; (vi) provide to a mask configuration information path a first clock signal that has a higher frequency than a frequency of a second clock signal that is provided to the multiple scan chains 20.

FIG. 1 illustrates a mask prevention unit 40 that bypasses mask unit 30 and provides the scan chain test responses outputted by the scan chains to the inputs of these scan chains. Each scan chain is connected to form a closed loop in which the scan chain test responses are maintained. The mask prevention period length can be defined in response to the length of the scan chains and in response to the manner in which the scan chain test responses should be outputted to compactor 14—whether these scan chain test responses should be provided in a wrapped manner or not.

Conveniently, the length of a scan chain out of multiple scan chains 20(i)-20(j) differs from a product of a positive integer by a length of mask unit configuration information. This can guarantee that different mask unit configurations are applied on scan chain test responses that circulate through the scan chains.

FIG. 2 illustrates mask prevention unit 40 that includes a storage unit 60 that is connected to the outputs of the scan chains 20(i)-20(j) and is adapted to store the outputted scan chain test responses during the mask prevention period. These stored scan chain test responses can then be retrieved, by retrieval circuit 70, to compactor 14 (directly or via mask unit 30) after the mask prevention period ends.

FIG. 3 illustrates a mask prevention unit 40 that provides a faster clock signal to mask configuration information path 11 than the clock signal provided to the multiple scan chains 20. It is noted that during scan mode device 10 usually operates at a much slower frequency than when operating at a normal operational mode. Accordingly, the provision of a faster clock signal to the mask configuration information path does not require re-designing device 10 but rather can involve using a normal mode operational clock signal or even a slower clock signal.

FIG. 4 illustrates mask unit 30 and its environment according to an embodiment of the invention.

Mask unit 30 include two mask circuits. First mask circuit 31 includes first mask flip-flops 37(1) and 37(2), first mask shadow flip-flops 36(1) and 36(2), first counter 38', first AND gate 38(4), decoder 32, as well as masking logic gates such as OR gates 36'(1)-36'(4), AND gates 36"(1)-36"(4) and enable gate 39 that also belong to second mask circuit 35. Second mask circuit 35 also includes (in addition to the masking logic gates) second mask flip flops 34(1)-34(4) and second mask shadow flip flops 36(1)-36(4). Counter 38' sends a clock signal to first mask shadow flip flops 38( ) and 38(2) such as to be configured each two scan cycles.

Second mask 33 is updated each four scan cycles. During these four scan cycles, first mask 31 can be re-configured four times. It is noted that if no masking is necessary the mask can be reset. If, for example, multiple test responses should be masked simultaneously first mask 31 can be reset thus masking these multiple test responses as well as valid test responses.

First mask flip-flops 37(1) and 37(2) are connected to each other. The data input of first mask flip-flop 37(1) receives first mask configuration information via input 35(1) of mask unit 30. The output of first mask flip-flops 37(1) is connected to the input of first mask flip-flop 37(2) and to the data input of first mask shadow flip-flop 38(1). The output of first mask flip-flop 37(2) is connected to the data input of first mask shadow flip-flop 38(2). The data outputs of first mask shadow flip-flops 38(1) and 38(2) are connected to two inputs of decoder 32.

Counter 38' and a mask resolution reset signal (provided from input 35(2) of mask unit 30) are connected to the inputs of AND gate 38(4). The output of AND gate 38(4) provides a reset signal to first mask shadow flip-flops 38(1) and 38(2). Mask resolution reset signal is provides to the reset inputs of first mask flip-flops 37(1) and 37(2), to the reset inputs of second mask flip flops 34(1)-34(4), to the reset input of second mask shadow flip flops 36(1)-36(4) and to an input of enable AND gate 39.

Second mask configuration information (provided via input 35(3) of mask unit 30) is provided to the data input of second mask data flip flop 34(1). Second mask flip flops 34(1)-34(4) are connected to each other in a serial manner. The data output of second mask flip flop 34(1) is connected to the data input of second mask shadow flip-flop 36(1). The data output of second mask flip flop 34(2) is connected to the data input of second mask shadow flip-flop 36(2). The data output of second mask flip flop 34(3) is connected to the data input of second mask shadow flip-flop 36(3). The data output of second mask shadow flip flop 34(4) is connected to the data input of first mask shadow flip-flop 36(4).

OR gate 36'(1) receives as input a first output signal of decoder 32, a mask enable signal (provided via input 35(4) of mask unit 30) and a data output signal from second mask shadow flip-flop 36(1). The output of OR gate 36'(1) is connected to a first input of AND gate 36"(1). The second input of AND gate 36"(1) is connected to the output of scan chain

20(1). Providing a '0' signal to the first input of AND gate 36"(1) masks a scan chain test response outputted from scan chain 20(1).

OR gate 36'(2) receives as input a second output signal of decoder 32, a mask enable signal (provided via input 35(4) of mask unit 30) and a data output signal from second mask shadow flip-flop 36(2). The output of OR gate 36'(2) is connected to a first input of AND gate 36"(2). The second input of AND gate 36"(2) is connected to the output of scan chain 20(2). Providing a '0' signal to the first input of AND gate 36"(2) masks a scan chain test response outputted from scan chain 20(2).

OR gate 36'(3) receives as input a third output signal of decoder 32, a mask enable signal (provided via input 35(4)) and a data output signal from second mask shadow flip-flop 36(3). The output of OR gate 36'(3) is connected to a first input of AND gate 36"(3). The second input of AND gate 36"(3) is connected to the output of scan chain 20(3). Providing a '0' signal to the first input of AND gate 36"(3) masks a scan chain test response outputted from scan chain 20(3).

OR gate 36'(4) receives as input a fourth output signal of decoder 32, a mask enable signal (provided via input 35(4) of scan unit 30) and a data output signal from second mask shadow flip-flop 36(4). The output of OR gate 36'(4) is connected to a first input of AND gate 36"(4). The second input of AND gate 36"(4) is connected to the output of scan chain 20(4). Providing a '0' signal to the first input of AND gate 36"(4) masks a scan chain test response outputted from scan chain 20(4).

Mask unit 30 ca mask, during four consecutive scan cycles, one scan chain after the other while the configuration of second mask remains unchanged. This provides a multi-dimension scanning scheme that enables to alter the masked scan chains relatively quickly.

Figure 5:
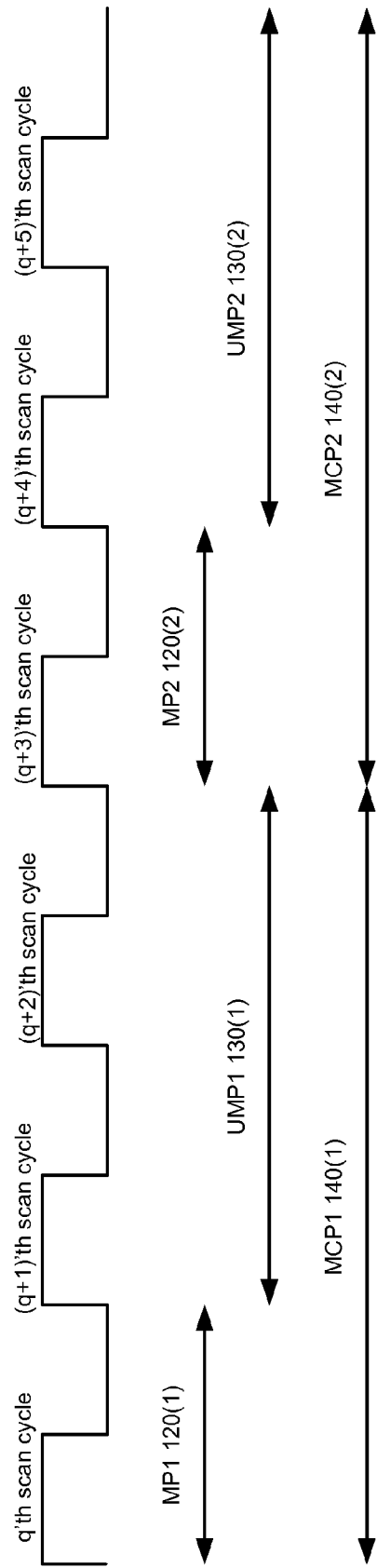
FIG. 5 is a timing diagram illustrating a relationship between masking periods and mask prevention periods, according to an embodiment of the invention.

FIG. 5 is a timing diagram 111 illustrating the relationship between masking periods and mask prevention periods according to an embodiment of the invention.

It is assumed that each mask unit 30 is connected to eight scan chains and that it includes a decoder such that the length of the mask unit configuration information is three bits. It is also assumed that the mask unit includes a shadow register that enables a propagation of mask configuration information even during a masking period.

The timing diagram starts at the q'th scan cycle. It is assumed that the mask unit should mask scan chain test responses outputted during the q'th scan cycle but that is should not mask (having the same configuration) scan chain test responses outputted during the (q+1)'th and (q+2)'th scan cycles. Accordingly, a first masking period MP1 120(1) occurs at the q'th scan cycle, the first mask prevention period UMP1 130(1) occurs at the (q+1)'th and (q+2)'th scan cycles and a first configuration period occurs at the q'th, (q+1)'th and (q+2)'th scan cycles. At the beginning of the (q+3)'th scan cycle the mask unit 30 can perform another masking operation while new mask configuration information is being provided to the mask unit. Accordingly, a second masking period MP2 120(2) occurs at the (q+3)'th scan cycle, the second mask prevention period UMP2 130(2) occurs at the (q+4)'th and (q+5)'th scan cycles and a second configuration period occurs at the (q+3)'th, (q+4)'th and (q+5)'th scan cycles.

A scan cycle can be equal to a single clock cycle of the clock signal triggers the propagation of scan chain test responses through the scan chains.

Figure 6:
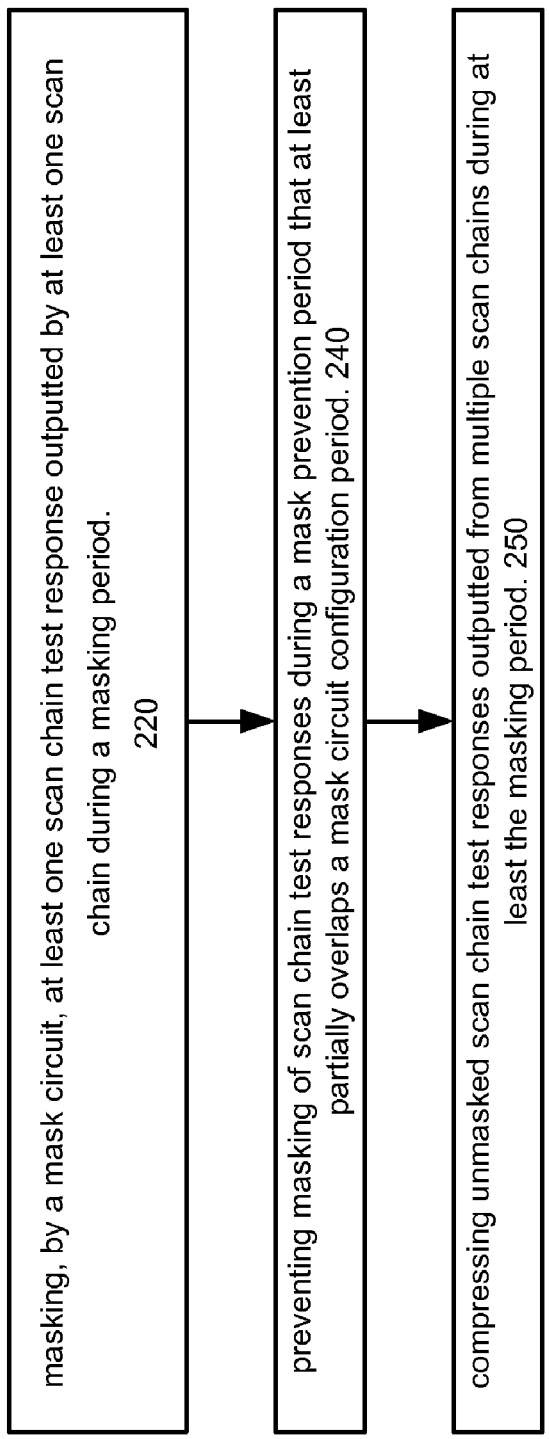
FIG. 6 is a flow chart of a method for testing a circuit, according to an embodiment of the invention.

FIG. 6 is a flow chart of method 200 for testing a circuit, according to an embodiment of the invention.

Method 200 starts by stage 220 of masking, by a mask unit, at least one scan chain test response outputted by at least one scan chain during a masking period.

Stage 220 is followed by stage 240 of preventing masking of scan chain test responses during a mask prevention period that at least partially overlaps a mask unit configuration period.

Method 200 also includes stage 250 of compressing mask preventioned scan chain test responses outputted from multiple scan chains during at least the masking period.

It is noted that the method 200 can be executed in a pipelined manner. Scan chain test responses that passed through a mask unit during stage 220 are compressed by a compactor while newer scan chain test responses can be provided to the mask prevention unit.

Conveniently, stage 240 of preventing can include at least one of the following operations, as well as a combination of at least two of the following operations: (i) bypassing the mask unit during the mask prevention period; (ii) stopping a propagation of scan chain test responses over the multiple scan chains during the mask prevention period while allowing a propagation of mask configuration information towards the mask unit; (iii) connecting an output of each scan chain to the input of the scan chain during the mask prevention period; (iv) propagating the scan chain test responses within the multiple scan chains until the multiple scan chains output scan chain test responses provided to the inputs of the multiple scan chains at the beginning of the mask prevention period; (v) storing, in at least one storage unit coupled to the outputs of the multiple scan chains scan chain test responses during the mask prevention period; and retrieving the scan chain test responses stored in the at least one storage unit 60 after an end of the mask prevention period; (vi) providing to a mask configuration information path a first clock signal that has a higher frequency than a frequency of a second clock signal that is provided to the multiple scan chains.

Figure 7:
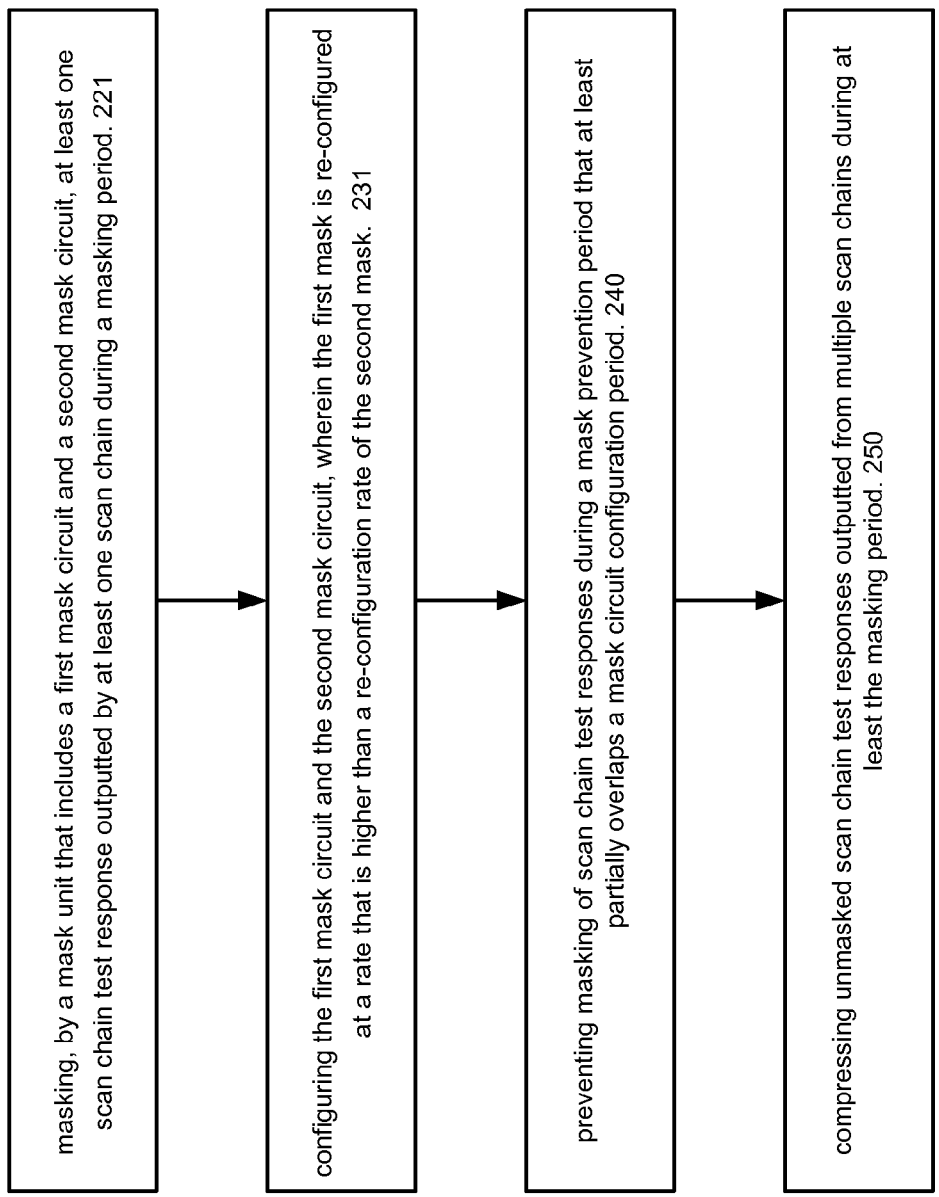
FIG. 7 is a flow chart of a method for testing a circuit, according to another embodiment of the invention.

FIG. 7 is a flow chart of method 201 for testing a circuit, according to an embodiment of the invention.

Method 201 starts by stage 221 of masking, by a mask unit that includes a first mask circuit and a second mask circuit, at least one scan chain test response outputted by at least one scan chain during a masking period.

Stage 221 can be followed by stage 231 or can overlap (or at least partially overlap) stage 231 of configuring the first mask circuit and the second mask circuit, wherein the first mask is re-configured at a rate that is higher than a re-configuration rate of the second mask. The first mask or the second mask can include a decoder that can speed up the configuration process by requiring more concise mask configuration information.

Stage 231 is followed by stage 240 of preventing the masking of scan chain test responses during a mask prevention period that at least partially overlaps a mask unit configuration period.

Conveniently, stage 231 of configuring includes propagating first mask configuration information via a first path and propagating second mask configuration information via a second path.

Method 201 also includes stage 250 of compressing mask preventioned scan chain test responses outputted from multiple scan chains during at least the masking period.

It is noted that the method 201 can be executed in a pipelined manner. Scan chain test responses that passed through a mask unit during stage 221 are compressed by a compactor while newer scan chain test responses can be provided to the mask prevention unit.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

We claim:

1. A device having testing capabilities, the device comprises:
   a tested circuit that comprises multiple scan chains;
   a compactor adapted to compress scan chain test responses;
   a mask unit, coupled between the multiple scan chains and the compactor, wherein the mask unit is adapted to mask scan chain test responses outputted by the multiple scan chains during a masking period; and
   a mask prevention unit, adapted to prevent masking of scan chain test responses during a mask prevention period that at least partially overlaps a mask unit configuration period.

2. The device according to claim 1 wherein the mask prevention unit bypasses the mask unit during the mask prevention period.

3. The device according to claim 1 wherein the mask prevention unit is adapted to stop a propagation of scan chain test responses over the multiple scan chains during the mask prevention period while allowing a propagation of mask configuration information towards the mask unit.

4. The device according to claim 1 wherein the mask prevention unit couples an output of each scan chain to an input of the scan chain during the mask prevention period.

5. The device according to claim 4 wherein the device is adapted to propagate the scan chain test responses within the multiple scan chains until the multiple scan chains output scan chain test responses provided to the inputs of the multiple scan chains at the beginning of the mask prevention period.

6. The device according to claim 1 wherein the mask prevention unit comprises at least one storage unit coupled to the outputs of the multiple scan chains, wherein the at least one storage unit is adapted to receive scan chain test responses during the mask prevention period; and a retrieval circuit adapted to retrieve the scan chain test responses stored in the at least one storage unit after an end of the mask prevention period.

7. The device according to claim 1 wherein a mask unit comprises a first mask and a second mask and wherein the first mask and second mask jointly mask scan chain test responses, wherein the first mask is re-configured at a rate that is higher than a re-configuration rate of the second mask.

8. A device having testing capabilities, the device comprises:
   a tested circuit that comprises multiple scan chains;
   a compactor adapted to compress scan chain test responses; a mask unit, coupled between the multiple scan chains and the compactor, wherein the mask unit comprises a first mask and a second mask and wherein the first mask and second mask jointly mask scan chain test responses, wherein the first mask is re-configured at a rate that is higher than a re-configuration rate of the second mask.

9. The device according to claim 8 wherein the mask unit is adapted to mask scan chain test responses outputted by the multiple scan chains during a masking period; and wherein the device further comprises a mask prevention unit, adapted to prevent masking of scan chain test responses during a mask prevention period that at least partially overlaps a mask unit configuration period.

10. The device according to claim 9 wherein the mask prevention unit couples an output of each scan chain to the input of the scan chain during the mask prevention period.

11. The method according to claim 10 wherein the preventing comprises storing, in at least one storage unit coupled to the outputs of the multiple scan chains scan chain test responses during the mask prevention period; and retrieving the scan chain test responses stored in the at least one storage unit after an end of the mask prevention period.

12. A method for testing a circuit, the method comprises:
   masking, by a mask unit, at least one masking period scan chain test response outputted by at least one scan chain during a masking period;
   preventing masking of mask prevention period scan chain test responses during a mask prevention period that at least partially overlaps a mask unit configuration period; and compressing unmasked scan chain test responses outputted from multiple scan chains during at least the masking period.

13. The method according to claim 12 wherein the preventing comprises bypassing the mask unit during the mask prevention period.

14. The method according to claim 12 wherein the preventing comprises stopping a propagation of scan chain test responses over the multiple scan chains during the mask prevention period while allowing a propagation of mask configuration information towards the mask unit.

15. The method according to claim 12 wherein the preventing comprises coupling an output of each scan chain to the input of the scan chain during the mask prevention period.

16. A method for testing a circuit, the method comprises:
   compressing scan chain test responses outputted from multiple scan chains during a masking period;
   masking, by a mask unit that comprises a first mask circuit and a second mask circuit, at least one scan chain test response outputted by at least one scan chain during a masking period; and
   configuring the first mask circuit and the second mask circuit, wherein the first mask is re-configured at a rate that is higher than a re-configuration rate of the second mask.

17. The method according to claim 16 further comprising preventing masking of scan chain test responses during a mask prevention period that at least partially overlaps a mask unit configuration period.

18. The method according to claim 17 wherein the preventing comprises coupling an output of each scan chain to the input of the scan chain during the mask prevention period.

19. The method according to claim 17 wherein the preventing comprises storing, in at least one storage unit coupled to the outputs of the multiple scan chains scan chain test responses during the mask prevention period; and retrieving the scan chain test responses stored in the at least one storage unit after an end of the mask prevention period.

20. The method according to claim 16 wherein the configuring comprises propagating first mask configuration information via a first path and propagating second mask configuration information via a second path.

* * * * *